United States Patent [19]

Fujita

[11] Patent Number: 4,890,082
[45] Date of Patent: Dec. 26, 1989

[54] COIL FOR GENERATING A HOMOGENEOUS MAGNETIC FIELD

[75] Inventor: Michiru Fujita, Kawasaki, Japan

[73] Assignee: Fuji Electric Co., Ltd., Kawasaki, Japan

[21] Appl. No.: 235,934

[22] Filed: Aug. 24, 1988

[30] Foreign Application Priority Data

Aug. 29, 1987 [JP] Japan .................. 62-215778

[51] Int. Cl.$^4$ ............................... H01F 7/00
[52] U.S. Cl. .................... 335/301; 335/216; 324/320
[58] Field of Search ............... 335/216, 299, 301, 304; 324/318, 319, 320

[56] References Cited

U.S. PATENT DOCUMENTS

| | | | |
|---|---|---|---|
| 3,287,630 | 11/1966 | Gang | 324/320 |
| 4,385,277 | 5/1983 | Hanley | 324/319 X |
| 4,587,504 | 5/1986 | Brown et al. | 335/216 |
| 4,701,736 | 10/1987 | McDougall et al. | 335/216 |
| 4,799,017 | 1/1989 | Siebold et al. | 324/319 |

FOREIGN PATENT DOCUMENTS

| | | |
|---|---|---|
| 144171 | 6/1985 | European Pat. Off. |
| 60-217608 | 4/1985 | Japan |
| 60-98344 | 10/1985 | Japan |

OTHER PUBLICATIONS

"The Coil Design of the Superconducting MRI Magnet" M. Fujita, Fuji Electric Corporate Research & Development Ltd.
"The Coil Design of the Superconducting MRI Magnet" M. Fujita et al.

*Primary Examiner*—George Harris
*Attorney, Agent, or Firm*—Spencer & Frank

[57] ABSTRACT

A coil for generating a homogeneous magnetic field has a first coil unit composing three pairs of coils each including a common central axis and being symmetric with respect to the center of the central axis and a second coil unit composing two pairs of coils provided outside of and axially with the first coil unit and being symmetric with respect to the center of the central axis. The magnetic moment of the first coil unit is identical in magnitude to and opposite in direction to that of the second coil unit, so that the magnetic field due to leakage flux is substantially cancelled out. Moreover, since each coil composing the first coil unit is selectively located in proper position and the amount of ampere-turn of each coil can be selected, it is possible to reduce to zero the coefficients of terms up to tenth order with respect to the strength distribution of magnetic fields on the central axis generated by the first and the second coil units, resulting in enhancing homogeneity of the magnetic field.

10 Claims, 9 Drawing Sheets

COIL FOR GENERATING A HOMOGENEOUS MAGNETIC FIELD

BACKGROUND OF THE INVENTION

1. Field of the Invention

The present invention relates to a coil for generating a homogeneous magnetic field in the interior space of a hollow cylindrical coil and more particularly to a magnet for generating a magnetic field for a nuclear magnetic resonance type computer tomogram imaging instrument (referred to as an MRI hereinafter).

2. Description of the Prior Art

A coil for generating a homogeneous magnetic field used for an MRI magnet is commonly composed of a plurality of cylindrical coils or ring coils having the inner diameter of approximately 1 meter in order to accommodate an object, that is, a human body in the coil. For obtaining an excellent tomogram which is of sufficient quality to diagnose the state of a human body, it is necessary to maintain the homogeneity of the magnetic field strength in the imaging space accommodating a human body at a level of $1 \times 10^{-6}$. For satisfying the necessary strength and the homogeneity of the magnetic field, a method for constructing a coil for generating a homogeneous magnetic field has been known, in which ring coils arranged coaxially are combined and their positions and values of electric current to be flowed are selected in such a manner that the homogeneity of the magnetic field is optimized. However, if the flux of the homogeneous magnetic field generated by a coil for generating a homogeneous magnetic field having such a construction is leaked to the external space, it may cause the electronic devices located close to the magnetic field to malfunction. Further, the magnetic field due to the leakage flux could magnetize a ferromagnetic substance located close to the MRI and this may distort the magnetic field so as to adversely affect the homogeneous magnetic field space. As a result, when the coil for generating a homogeneous magnetic field is used alone, if the magnetic field having high homogeneity is generated, the expected homogeneous magnetic field cannot be obtained in the environment in which the MRI is used. Hence, in order to prevent the spread of leakage fluxes to the outside, a magnetic shield is often provided to cover the coil for generating a homogeneous magnetic field. However, the method for absorbing leakage fluxes using a ferro-magnetic substance has a problem that since the strength of leakage fluxes is higher with higher strength of a homogeneous magnetic field, especially in the case of using a superconductive MRI, the weight of the magnetic substance shielding material is too large, and the weight may be over the permissive load of the chamber floor in which an MRI is located. Especially for reducing the leakage flux in the superconductive MRI, therefore, the method of cancelling the magnetic field due to the leakage fluxes using a superconductive coil has been employed.

This method does not use any magnetic substance and hardly offers the effects caused by the magnetic substances located close to an MRI on homogeneous magnetic field space, so that it is easy to perform a magnetic field analysis needed to design a coil for generating a homogeneous magnetic field. It means that the magnetic field generating coil equipped with a second superconductive coil for cancelling the leakage fluxes is a very effective coil for a superconductive MRI which is especially required to form a highly homogeneous magnetic field space. This method indicates that a superconductive coil serves to cancel the magnetic field leaked out of a homogeneous magnetic field generated by a coil for generating a homogeneous magnetic field used as a superconductive MRI magnet. And it is referred to as an active shield type superconductive MRI magnet (hereinafter, simply referred to as an active shield type).

The active shield type must meet the following two requirements.

(1) Forming a homogeneous magnetic field at given homogeneity within given space; and (2) Lowering the magnetic flux leaked outside of a given range from an MRI to be equal to or less than a given value.

A homogeneous magnetic field of high homogeneity with only several PPMs level variation is required as described above. The strength of the magnetic field due to leakage flux must be as small as 5 G (0.5 mT) or less in the space located at a predetermined distance from an MRI in comparison with the uniform space magnetic field strength of about 1 T. Furthermore, under the state of meeting these two conditions, the following actual practical requirements must be considered.

(3) In order to reduce a closeness feeling of a patient, or anxiety of such a feeling when a patient gets into an MRI in checking himself or herself as much as possible, the length of a coil for generating a homogeneous magnetic field must be as short as possible.

(4) The diameter of a coil for generating a homogeneous magnetic field must be as small as possible due to some restraints such as the size of a room and the height of its ceiling provided when an MRI is installed in a non-specific room.

In order to achieve higher homogeneity and restrain the strength of magnetic field due to leakage flux more, the following two requirements in designing and manufacturing the coil must be also considered.

(5) Constructions and conditions settings must be such that a magnetic field analysis which is essential designing a coil for generating a homogeneous magnetic field.

(6) Constructions must be such that a coil is manufactured with accuracy needed to secure a homogeneous magnetic field.

The coil for generating a homogeneous magnetic field itself must be large enough to secure given homogeneous space. Since an MRI must be somewhat restricted in size to be accommodated in the defined space of a room, the smaller the device, the more universal and the less expensive it is. Thus, it is preferable that the smaller coil for generating a homogeneous magnetic field can secure larger homogeneous space. However, the coil for generating a homogeneous magnetic field must have an inner diameter size of at least 1 meter, because a human body must be inserted into the inner space of the coil. Additionally, a lot of other coils, such as a high frequency coil and a gradient coil, also are disposed into this inner space, and further because a space for thermal insulation is required to install the coil in a cryostat when a superconducting magnet is used. On the other hand, the size of homogeneous magnetic field space is relevant to the size of a human body. Usually, a sphere with about 40 cm diameter is required as homogeneous magnetic field space. Further, in case of a superconductive magnet, the generated magnetic field is 0.5 T to 2 T which is ten times as large as about 0.1 T of the normal conductive magnet, so that the homogeneity required by it is several PPMs, which is one digit higher than that required by the normal magnet.

The coil for generating a homogeneous magnetic field provided in such a manner that the larger homogeneous space with higher homogeneity is formed, can be constructed by increasing the number of coil rings composing the coil. In case of, however, employing the construction wherein the homogeneity corresponding to the increased number of coil rings is secured, the axial length is increased, so that a patient may feel more closeness as mentioned above as well as the manufacture of an MRI magnet costs more because of the increased number of coil rings. Moreover, as the axial length is increased, the ampere-turn must be increased so as to secure the same magnetic field strength as before. Since the increase of coil rings brings about the increase of materials to be used and capacitance of a D/C power source, it results in an increase of weight and cost. Therefore, it is disadvantageous to unduly increase the coil rings in number even if it results in providing superior homogeneity.

The active shield type magnet has been already disclosed in laid-open the Japanese Patent Application No. 60-98344 entitled "Nuclear Magnetic Resonance Apparatus", U.S. Pat. No. 4,587,504 entitled "Magnet Assembly for Use in NMR Apparatus" and laid-open Japanese Patent Application No. 60-217608 entitled "Homogeneous magnetic Field Coil". These publications, however, do not disclose an optimum construction of a coil for generating a homogeneous magnetic field from a comprehensive view point as described above.

As mentioned above, various proposals have been provided for an active shield type superconductive MRI magnet, but, no proposal is provided for an optimum construction thereof from a comprehensive view point. Accordingly, when a coil for generating a homogeneous magnetic field is designed and manufactured, the coil is apt to be larger and more expensive than the optimum construction. Furthermore, the active shield type has a disadvantage that a patient may feel more closeness since the overall axial length of the coil for generating a homogeneous magnetic field is further increased due to the provision of an outer side coil.

SUMMARY OF THE INVENTION

It is an object of the present invention to provide a coil for generating a homogeneous magnetic field which, as to an active shield type superconductive MRI, provides higher homogeneity of a magnetic field in a larger space, reduces the strength of the leaked magnetic field at a given distance from an MRI magnet and has smaller axial length for reducing the largest factor of closeness given to a patient.

To achieve this purpose, the present invention provides in the context of a coil for generating a homogeneous magnetic field, including a first coil unit having at least one coil being symmetric with respect to a common symmetry axis and a symmetry plane located perpendicular to the symmetry axis, and a second coil unit having at least one coil being symmetric with respect to the symmetry axis and the symmetry plane, a minimum internal diameter of the coil composing the second coil unit being larger than a maximum external diameter of the coil composing the first coil unit, the following additional features:

the first coil unit being composed of three pairs of coils;

the second coil unit being composed of two pairs of coils;

the magnetic moment of the first coil unit being identical in magnitude to and reverse in direction to that of the second coil unit; and the first coil unit substantially reducing to zero the coefficients of the terms of the second to tenth degree of Taylor's series expanded with respect to axial coordinate variables of distribution of magnetic fields on the symmetry axis generated by the first coil unit and the second coil unit.

Here, the axial length of the second coil unit may be substantially equal to that of the first coil unit.

The axial external length of the second coil unit may be smaller than that of the first coil unit.

Three pairs of coils composing the first coil unit may have the same internal diameters and two pairs of coils composing the second coil unit may have the same internal diameters.

The second coil unit may reduce to zero the coefficients of the terms of the second to sixth degree of Taylor's series expanded with respect to axial coordinate variables of distribution of magnetic fields on the symmetry axis generated solely by the second coil unit; the axial external length of the second coil unit may be smaller than that of the first coil unit; and three pairs of coils composing the first coil unit may have the same internal diameters and two pairs of coils composing the second coil unit may have the same internal diameters.

The second coil unit may not reduce to zero coefficients of terms of second to sixth degree of Taylor's series expanded with respect to axial coordinate variables of distribution of magnetic fields on the symmetry axis generated solely by the second coil unit, the axial external length of the second coil unit may be smaller than that of the first coil unit, and three pairs of coils composing the first coil unit may have the same internal diameters and two pairs of coils composing the second coil unit may have the same internal diameters.

The first coil unit may be electrically connected to the second coil unit in series.

The three pairs of coils composing the first coil unit and the two pairs of coils composing the second coil unit may be electrically connected in series, respectively.

The three pairs of coils composing the first coil unit and the two pairs of coils composing the second coil unit may be electrically connected in parallel, respectively.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Hereinafter, the present invention will be described on the basis of the embodiments.

Figure 1:
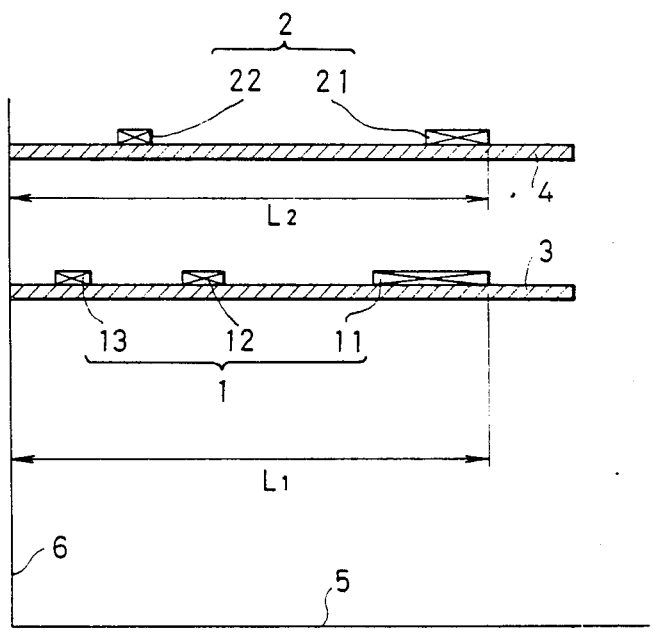
FIG. 1 is a partial sectional view showing a construction of an embodiment of a coil for generating a homogeneous magnetic field according to the present invention.

FIG. 1 is a partial sectional view for explaining a construction of a coil for generating a homogeneous magnetic field according to the present invention. A first coil unit 1 includes coils 11, 12 and 13. A second coil unit 2 includes coils 21 and 22. The coils 11, 12 and 13 are each wound on a bobbin 3 and the coils 21 and 22 are each wound on a bobbin 4. FIG. 1 shows only an upper right half section of a coil for generating a homogeneous magnetic field. Coils 11, 12, 13, 21 and 22 have a rotation symmetry axis 5. Also, the bobbins 3 and 4 are cylinders having the rotation symmetry axis 5. Furthermore, these coils and cylinders are symmetric with respect to a symmetry plane 6, so that unshown symmetric coils and bobbins are located on left side of the symmetry plane 6 in the same manner as coils and bobbins shown in FIG. 1. That is, in FIG. 1 only the halves of pairs of the coils are shown. The first coil unit functions as main coils for inducing a magnetic field of desired strength in the imaging space and the second coil unit functions as canceling coils for canceling the leakage flux induced by the first coil unit.

The coils 11, 12 and 13 composing the first coil unit 1 and the coils 21 and 22 composing the second coil unit 2 may be electrically connected in series or in parallel, respectively, or may be also connected to separate power sources. When the coils 11, 12 and 13 and the coils 21 and 22 are electrically connected in series or in parallel, the first coil unit 1 may be electrically connected to the second coil unit 2 in series.

An electric current flows through all the coils composing the first coil unit 1, which include those located on the left side of the plane of symmetry not shown, in one direction. Likewise, an electric current flows through all the coils composing the second coil unit 2 in the opposite direction to that of the coil unit 1. Furthermore, the coils are symmetric with respect to the rotation symmetry axis 5 as well as the symmetry plane 6. It means that the magnetic fields generated by these coils are symmetric with respect to the symmetry axis 5 and the symmetry plane 6.

The axial length of a coil for generating a homogeneous magnetic field is determined by a larger value of both the axial lengths of the first coil unit 1 and the second coil unit 2. FIG. 1 shows an embodiment in which the axial lengths of both coil units are substantially the same with each other. That is, the distance between the symmetry plane symmetry 6 and the outer side plane of the coil 11 is assumed as the axial length $L_1$ of the first coil unit 1 and the distance between the symmetry plane 6 and the outer side plane of the coil 21 is assumed as the axial length $L_2$ of the second coil unit 2. In FIG. 1, axial lengths $L_1$ and $L_2$ are substantially the same with each other. The first coil unit 1 and the second coil unit 2 have the identical magnetic moment in the range of possible accuracy given by numerical calculations in designing them. The magnetic moment can be easily calculated using the following equation.

Considering a circular coil consisting of a conductor whose section is quite small, the magnetic moment of this coil is represented by a product of a circle area enclosed the conductor and a current flowing through the conductor. Namely, $$m = si \qquad (1)$$

where,
- m: magnetic moment of this coil
- s: circle area enclosed by this coil conductor (assuming a radius of a circle as r, $s = r^2$ is given.)
- i: current flowing through the conductor Assuming the magnetic moment of the first coil unit 1 as $M_1$, $M_1$ is obtained by cumulating the equation (1) for each superconductive wire with regard to the coil composing this first coil unit 1. That is, $$M_1 = \mu_0 \left( \sum_{N=1}^{C_1} \sum_{j=1}^{N_N} \pi r_{Nj}^2 \right) I_1 \qquad (2)$$

where,
- $\mu_0$: permeability in vacuume ($4\pi \times 10^7$)
- $C_1$: number of pairs of coils composing the first coil unit 1 (means 3 in this embodiment)
- $N_1$: Number of turns of N-th coil
- $r_{Nj}$: radius position of the superconductive wire
- $I_1$: current value of the superconductive wire of the first coil unit The magnetic moment $M_2$ can be obtained by changing the index from 1 to 2 in the above-described equation. The current direction is opposite to that of the coil unit 1. Thus, if the magnetic moment of the first coil unit 1 is held positive, that of the second coil unit 2 is held negative. The relationship of the magnetic moment between both coil units is made to be the following equation using $M_1$ and $M_2$.

$$M_1 + M_2 = 0 \qquad (3)$$

The magnetic flux density $B_{ir}$ of the magnetic field generated at the location fairly far away from these coil units by the first coil unit 1 is approximatively represented by the following equation.

$$B_{1r} = M_1 \left\{ K_3 \frac{1}{r^3} + k_5 \frac{a_{1e}^2}{r^5} + \ldots \right\} \quad (4)$$

where, r: distance from the center of the coil
$a_{le}$: equivalent radius of the first coil unit
$K_3, K_5$: coefficient of a term of each degree in series expansion (irrespective of equivalent radius $a_{le}$)

As is understood from this equation, if the magnetic field is generated by one coil, the strength of a magnetic flux leaked outside of the coil is reduced in inverse proportion to a cube of a distance from the center of the coil. In case of a superconductive MRI magnet with about 1m diameter and 1T magnetic flux density generated on the center, it is not expected to attenuate the leaked magnetic field to the level that it does not effect a nearby room located at several meters' distance from the MRI instrument or the MRI device itself except its magnet. It means that it is necessary to provide an active shield type of second coil unit.

Like the first coil unit 1, the magnetic flux density $B_{2r}$ of the second coil unit 2 is represented by the following equation.

$$B_{2r} = M_2 \left\{ K_3 \frac{1}{r^3} + k_5 \frac{a_{2a}}{r^5} + \ldots \right\} \quad (5)$$

The magnetic fields generated by these two coil units are represented by a sum of the above-identified equations (4) and (5), resulting in the following equation.

$$B_r = k_3 \frac{M_1 + M_2}{r^3} + k_5 \frac{a_{1e}^2 M_1 + a_{2e}^2 M_2}{r^5} + \ldots \quad (6)$$

The equation (6) is arranged to be the following equation by substituting the equation (3) into this equation.

$$B_r = k_5 \frac{(a_{1e}^2 M_1 + a_{2e}^2) M_1}{r^5} + \ldots \quad (7)$$

That is, if the magnetic moment $M_1$ of the first coil unit 1 is identical in magnitude to and reverse in the direction to the magnetic moment $M_2$ of the second coil unit 2, the strength of the magnetic field due to leakage flux is reduced in inverse proportion to a fifth power of distance from the center of the coil. Thus, as the distance from the center of the coil is increased, the leaked magnetic field is abruptly reduced. For example, assuming the radius of the first coil unit 1 as 0.5 m, the radius of the second coil unit 2 as 0.7 m and the magnetic flux density of a homogeneous magnetic field in the center of the coil generated by these two coil units as 1 T, the magnetic flux density of the leaked magnetic field located at 3 m distance from the center of the coil is about 1.3 G and the fair reduction effect is realized. When a homogeneous magnetic field of 1 T is generated in the center of the coil by the first coil unit alone, the magnetic flux density of the leaked magnetic field at 3 m distance from the center of the coil is about 50 G, which is far larger than the allowable value of the strength of the leaked magnetic field, that is, 5 G.

As described above, if the magnetic moments of the two coil units have the same value and are opposite in direction to each other, the strength of the leaked magnetic field can be cleared. The magnetic moment can be easily calculated by setting the number and the size of coils composing each coil unit, so that, in the process of designing a coil for generating a homogeneous magnetic field, a calculation can be done which satisfies the condition that the magnetic moment of one coil unit is identical to that of the other coil unit. Hence, an efficient design calculation is achieved.

Figure 2:
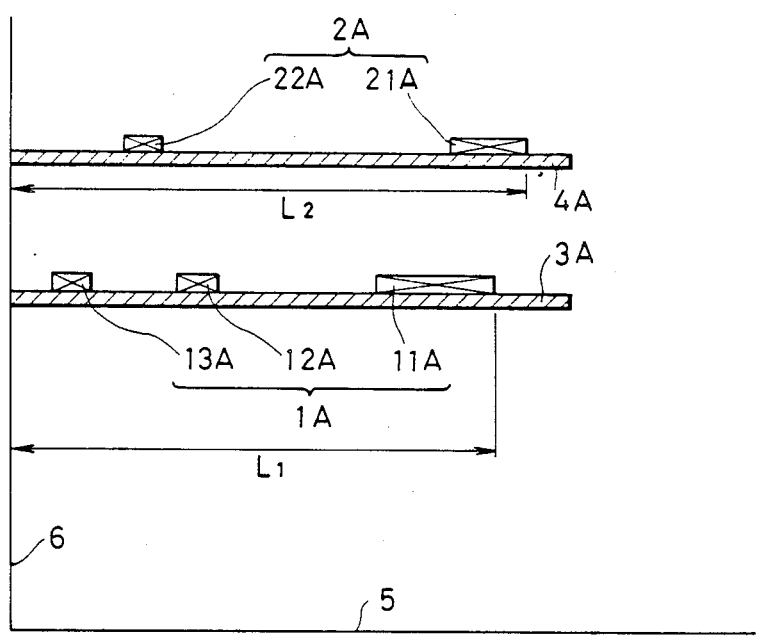
FIG. 2 is a partial sectional view showing a construction of another embodiment of a coil for generating a homogeneous magnetic field according to the present invention.

FIG. 2 shows a construction of a coil for generating a homogeneous magnetic field having a second coil unit 2A composed of two pairs of coils and, by itself, keeping optimum homogeneity. The optimum construction is defined by the location and the ampere-turn of two pairs of coils. Like FIG. 1, FIG. 2 is a partial section. In this embodiment, a second coil unit 2A includes coils 21A and 22A. The outer coil 21A is located outside of the outermost coil 11A of the first coil unit including coils 11A, 12A and 13A. It means that the axial length $L_2$ of the second coil unit 2A is larger than the axial length $L_1$ of the first coil unit 1A, so that the axial length L of the coil for generating a homogeneous magnetic field is defined by $L_2$. In the embodiment shown in FIG. 1, the coil 21 is located closer to the symmetry plane 6 out of the optimum condition position shown in FIG. 2, that is, the position of the coil 21A. Thus, the second coil unit 2 shown in FIG. 1, by itself, does not satisfy the optimum condition of the homogeneity. The optimum condition allows the coefficients of terms up to the 6th order in Taylor's expansion series provided by expanding the magnetic field strength distribution on the symmetry axis 5 to be reduced to zero. But, since the coil 21 is located out of the optimum condition position, the coefficients of the second, fourth and sixth order terms have non-zero values in the magnetic field generated by the second coil unit 2. However, since the second coil unit 2 is located far closer to the optimum condition position as described later, the coefficients of these order terms do not have excessive values, which indeed should be zero if the coil unit 2 is located on the optimum condition position.

In FIG. 2, the first coil unit 1A, has each coil located a bit out of the optimum condition by itself. One of the reasons is as follows. Even if the second coil unit 2A is located at the optimum condition position, the strength distribution on the axis of symmetry of a magnetic field caused by the second coil unit 2A includes the coefficients of terms higher than the 8th order which cannot be reduced to zero. These higher order components serve to distort a homogeneous magnetic field. On the other hand, the first coil unit 1A including three pairs of coils can reduce the coefficients of terms up to the 10th order to zero, so that the size and the ampere-turn are set to reduce coefficients of the second to the 10th order terms to zero so that the size and the ampere-turn are set to reduce coefficients of the second to the 10th order terms to zero in the strength distribution of the magnetic field generated by the second coil unit 2A. Accordingly, the coils 11A, 12A and 13A of the first coil unit are located out of the optimum condition position defined for a sole coil unit including three pairs of coil, so as to reduce to zero all the coefficients of higher order terms in the strength distribution of a magnetic field generated by the second coil unit 2A.

Furthermore, in the coil configuration shown in FIG. 1, the second coil unit 2 is also located out of the optimum condition position defined for a sole coil unit, so that all the coefficients of terms of Taylor's series provided with regard to the second coil unit 2 are reduced to zero up to 10th order by virtue of the first coil unit 1. As a result, it is to be understood that the first coil unit 1 is located farther out of the optimum condition position defined for a sole coil unit than the case shown in FIG. 2.

How to locate the second coil unit on the optimum condition position and make the axial length $L_2$ of the second coil unit coincide with the axial length $L_1$ of the first coil unit will be accomplished as follows. At first, the second coil unit 2 is solely located on the optimum condition position and then the first coil unit 1 is set to reduce the coefficients of 2nd to 10th degree terms of Taylor's series with respect to the magnetic fields generated by these first and second coil units 1 and 2. Under this condition, like the construction shown in FIG. 2, the axial length $L'_2$ of the second coil unit 2 has a larger value than the axial length $L'_1$ of the first coil unit. Next, the axial length $L'_2$ is set as a little smaller value than the axial length $L'_1$ and the optimum condition is found, again, calculating the length of the first coil unit so as to find the condition under which the coefficients of 2nd to 10th degree terms with respect to the magnetic field covering the second coil are reduced to zero. As a result, the difference between the axial lengths $L'_1$ and $L'_2$ is smaller than that calculated previously. Repeating such a calculation twice or three times results in finding the condition under which the axial lengths $L_1$ and $L_2$ substantially coincide with each other as shown in FIG. 1. Since the difference between these axial lengths $L_1$ and $L_2$ is not so much associated with the homogeneity of a magnetic field, highly accurate coincidence is not needed. Furthermore, the result of the calculation states that the axial length $L_1$ is smaller when the axial length $L_2$ has a value smaller than the axial length $L_1$. It means that it is better to set the axial length $L_2$ to a smaller value than the axial length $L_1$ to minimize the axial length $L$ of a coil for generating a homogeneous magnetic field.

Figure 3:
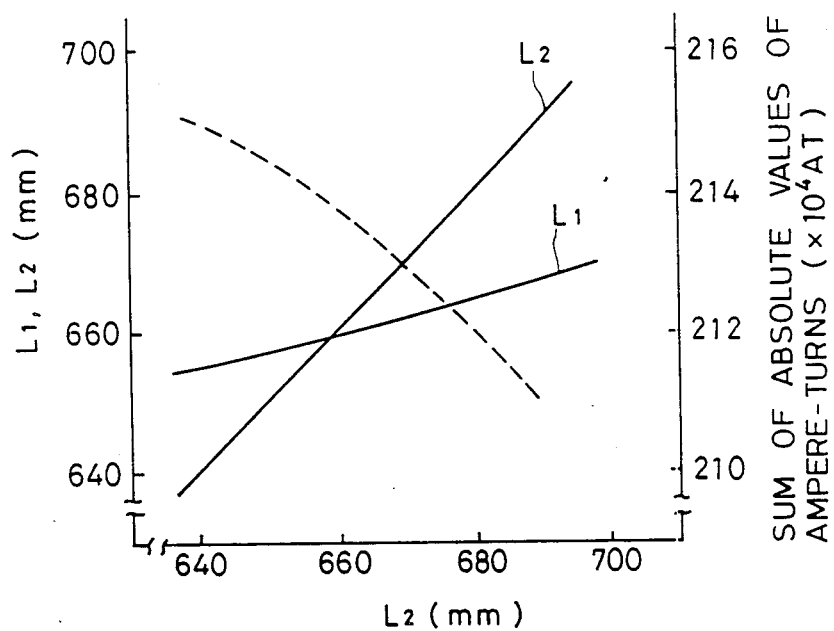
FIG. 3 is a characteristic diagram illustrating the relationship among an axial length $L_2$ of a second coil, an axial length $L_1$ and a sum of ampere-turns of both coils.

FIG. 3 shows the relation between the optimum axial length $L_2$ of the second coil unit and the optimum axial length of the first coil unit $L_1$ and between $L_2$ and a sum of absolute values of ampere-turns of the first and the second coil units for generating a given uniform magnetic field strength. In FIG. 3, $L_2$ is changed while maintaining the optimum condition of coil unit including two pairs of coils, that is, as reducing to zero the coefficients of second, fourth and sixth order terms with respect to the distribution of strength of the magnetic field on the symmetry axis generated by the second unit, the optimum axial length $L_1$ of the first coil unit, namely the axial length to reduce to zero the coefficients of terms up to tenth degree with respect to the distribution strength of the magnetic fields generated by the first and the second coil units, changes in accordance with $L_2$. The sum of ampere-turns also changes with $L_2$. The coil construction shown in FIG. 2 means $L_2=688$ (mm) in FIG. 3. With the decrease of $L_2$, $L_1$ decreases as shown in FIG. 3. The variation of $L_1$, however, is small and $L_1$ and $L_2$ coincide with each other when $L_2$ is a bit smaller than 660 (mm). With the further decrease of $L_2$, $L_1$ is getting larger than $L_2$. The coil construction shown in FIG. 1 means the example wherein the second coil unit does not reach the optimal condition by itself and $L_1=L_2=660$ (mm) is offered.

As shown in FIG. 3, as the axial length $L_2$ is made smaller, a sum of absolute values of ampere-turns of the first and the second coil units is apt to increase. Hence, it is better not to decrease the axial length $L_2$ too much from an economical point of view since a superconductive wire is needed more when $L_2$ is too small. After all from a general point of view, it is most proper to make the first coil unit substantially coincide with the second coil unit in respect of the axial length.

Even if the second coil unit, by itself, does not reach the optimum condition for homogeneity, the first coil unit aids it to secure the optimum homogeneity. Thus, the number of pairs of coils composing the first coil unit is an important factor for satisfying the requirement for homogeneity of the coil for generating a homogeneous magnetic field. The homogeneous space required for accommodating a human body is a sphere with a diameter of 40 cm. The inner diameter of the coil for generating a homogeneous magnetic field has a minimum allowable value of 1 m or so and the homogeneity required is at the PPM unit level. As a result, the homogeneity offered with two pairs of coils composing the first coil unit is at most several tens PPM. Thus, the number of pairs of coils composing the coil unit should be more than two, that is, three, with which the homogeneity offered is several PPMs, thereby meeting the given optimum condition. Four pairs of coils serve to improve homogeneity. However, from a view of accuracy in manufacture, it is difficult and not necessary to realize the four pairs of coils. The four-pairs construction is excessive in quality. In conclusion, the active shield type superconductive MRI magnet, the object of which is a human body, should have three pairs of coils composing the first coil unit, that is, six coils.

The construction of the second coil unit can be selected more freely than that of the first coil unit. It is possible to construct it with one coil and locate it quite close to the symmetry plane. Even in this construction, the coefficients of terms up to 10th order can be reduced to zero by properly locating three pairs of coils composing the first coil unit. In this case, the unnecessary magnetic field components of the second coil unit are cancelled by distributing a large ampere-turn to the coils located close to the symmetry plane 6 selected among the coils of the first coil unit. Hence, each coil unit strongly cancels each magnetic field, which may bring about a disadvantage in respect of effective use of ampereturns. Accordingly, some disadvantage occurs as a larger ampere-turn is required to secure a given strength of a homogeneous magnetic field. In order to avoid this disadvantage, it is possible to widely distribute the ampere-turns so as to make one coil agree with the axial length of the first coil unit. However, it is difficult to fix a superconductive line widely wound on the bobbin along the axial length and thus, in actuality, it is not an effective method.

Furthermore, even if the second coil unit is composed of two coils (one pair), there occurs the problem provided in case of one coil. In conclusion, as shown in FIG. 1, it is generally the best construction that the second coil unit is composed of four coils, that is, two pairs. As described above, when the second coil unit is composed of two pairs, it is able to make the axial length and ampere-turn distribution substantially optimum, and thus can accept the optimum size and ampere-turn distribution of the first coil unit. Furthermore, the magnitude of the ampere-turn becomes suitable for securing a given homogeneous magnetic field strength. In the coil for generating a homogeneous magnetic field construction used in the active shield type superconductive MRI magnet, the optimum construction is the combination of three pairs of coils composing a first coil unit located inside and two pairs of coils composing a second coil unit located outside. Moreover, the general optimum condition of a coil for generating a homogeneous magnetic field is to set the sizes and the ampere-turns of both coil units to make the axial length of the second coil unit fit that of the first coil unit.

The radial lengths of respective coils composing these coil units should be close to each other as much as possible since these coil units are accommodated in a cryotoron common to them. However, the difference of radii between the first coil unit and the second coil unit serves to clear the external magnetic fields. In addition, as the difference is made smaller, the clearing effect on the magnetic fields is made larger and thus large ampere-turn is required to secure a given homogeneous magnetic field strength. As a result, it is advantageous to increase the radius of the second coil unit as much as possible in the allowable range of the coil for generating a homogeneous magnetic field. It means that the radius of the second coil unit is required to be properly selected. Further, it is preferable that each coil composing each coil unit has the same radius at each coil unit.

The second coil unit is not required to generate the optimum homogeneous magnetic field and, besides, is in a wide allowable range of designing the size. Thus, it is easy to make the coils coincide with each other in their radius. In particular, forming similar internal diameters is advantageous in size accuracy and mechanical strength since the coils are provided on the same bobbin.

The first coil unit is required to secure homogeneity by virtue of the size of coils composing the coil unit and the distribution of ampere-turn since it must serve as a coil for generating a homogeneous magnetic field. Thus, the key point is to secure the allowable range of radius size. Five variables may be varied in order to reduce the coefficients of terms up to 10th order of the magnetic field strength distribution to zero. In FIG. 1, it is possible to assume the ampere-turns of the coils 11 and 12 as variables with respect to the ratios to the ampere-turn of the coils 11, 12 and 13 as variables. Hence, the internal diameters of respective coils composing the first coil unit are similarly set by calculating the optimum condition with these five variants assumed as unknowns.

Moreover, it is possible to delete the coefficients of terms up to 10th degree with the ampere-turn and the axial position of each coil composing the first coil unit assumed as variables. However, in actuality the ampere-turn of each coil is a product of current flowing through one superconductive line and number of turns which must be an integer. Further, when the turns are assigned to the axial direction and the radial one, a superconductive line is arranged in rectangular section so as to make a product of the number of both turns in the radial direction and in the axial direction identical to the number of turns of the coil and then the superconductive wire wound in the axial direction is piled in the radial direction. Thus, it is inevitable that the number of turns of a coil must be an integer multiple of the number of turns assigned in the axial direction. This restraint related to the number of turns of each coil is an obstacle to applying the optimum condition of the first coil unit obtained by the above-mentioned method to an actual homogeneous magnetic field generating coil without any change.

Consequently, after setting the number of turns for each coil to get closer to the optimum condition obtained from the ampere-turn of each coil assumed as a continuous quantity and to be applied to each coil, the axial position of five pairs of coils included in the first coil unit and the second coil unit are set as variables and then the condition for reducing the coefficients of terms up to the 10th order to zero is newly searched. In this case, the number of unknowns required for reducing the coefficients of terms up to the 10th order to zero must be 5 as described above. The fact that the number of pairs of coils contained in a coil for generating a homogeneous magnetic field is identical to the above-stated number is the effect offered when the second coil unit is constructed by two pairs of coils.

Now, the inhomogeneous components, flux distributions, sizes and coil volumes of the coils for generating a homogeneous magnetic field according to the present invention will be explained below. The coil configuration shown in FIG. 2, in which the second coil unit (canceling coils) is optimaly designed and the length $L_2$ thereof is greater than the length $L_1$ of the first coil unit (main coils), is designated as type-A coil configuration, while the coil configuration shown in FIG. 1, in which $L_2$ is equal to $L_1$, is designated as type-B coil configuration.

The parameters for the calculated results shown in the following FIGS. 4-7 are given below.

| | |
|---|---|
| center magnetic flux density | 0.5 T |
| current density | 200A/mm$^2$ |
| inner radius of the main coils | 500 mm |
| inner radius of the canceling coils | 750 mm |
| diameter of the supercconducting wire | 1.0 mm |
| number of layers of the conductor in each block | 11 |
| thickness of the layer isolation film | 0.5 mm |

The inhomogeneous flux components of the type-A coil configuration is shown in Table 1. As shown in this table, the inhomogeneous flux component induced by the canceling coils is zero up to the 6th order. The main coils are arranged in such a manner that they compensate the inhomogeneous flux components of the 8th and 10th order induced by the canceling coils, so that the resultant inhomogeneous flux components become zero from the 2nd to the 10th order.

TABLE 1

| order | main coil | canceling coil | sum |
|---|---|---|---|
| 0 | 7642 G | −2642 G | 5000 G |
| 2 | 0.0 ppm | 0.0 ppm | 0.0 ppm |
| 4 | 0.0 ppm | 0.0 ppm | 0.0 ppm |
| 6 | 0.0 ppm | 0.0 ppm | 0.0 ppm |
| 8 | −4.7 ppm | 4.7 ppm | 0.0 ppm |
| 10 | 0.5 ppm | −0.5 ppm | 0.0 ppm |
| 12 | −1.8 ppm | 0.0 ppm | −1.8 ppm | ppm is in 35 cm sphere

Figure 4:
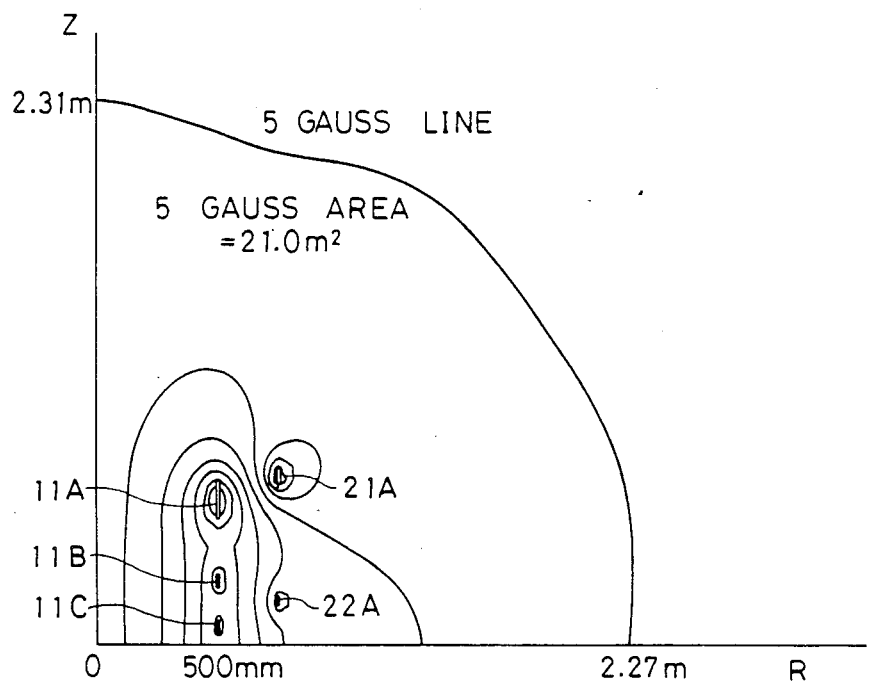
FIGS. 4 and 5 are diagrams illustrating a magnetic flux distribution and a magnetic field homoneneity of an embodiment according to the present invention, respectively.
Figure 5:
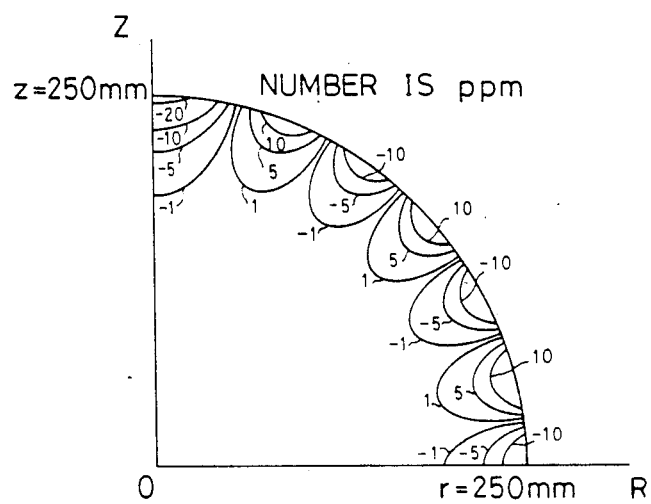

The flux distribution and the 5 gauss line for the main and canceling coils of the type-A coil configuration are shown in FIG. 4. The positions of main coils 11A, 11B and 11C and canceling coils 21A and 22A are indicated in FIG. 4. In FIG. 4, the horizontal line (R-axis) and the vertical line (Z-axis) correspond to a line on the symmetry plane 6 and the symmetry axis 5 shown in FIG. 1, respectively, and the cross point 0 of the R-and Z-axis is the center of the coil configuration. The field homogeneity in the vicinity of the center of the type-A coil configuration is shown in FIG. 5 with equi-ppm lines indicating the relative difference between the magnetic flux density at each point in the sphere and that at the center by ppm unit.

The inhomogeneous flux components of type-B coil configuration is shown in Table 2.

TABLE 2

| order | main coil | canceling coil | sum |
|---|---|---|---|
| 0 | 7892 G | −2892 G | 5000 G |
| 2 | −2267 ppm | 2267 ppm | 0.0 ppm |
| 4 | −142 ppm | 142 ppm | 0.0 ppm |
| 6 | −23 ppm | 23 ppm | 0.0 ppm |
| 8 | −2 ppm | 2 ppm | 0.0 ppm |
| 10 | 0.4 ppm | −0.4 ppm | 0.0 ppm |
| 12 | −1.8 ppm | 0.0 ppm | −1.8 ppm | ppm is in 35 cm sphere

Figure 6:
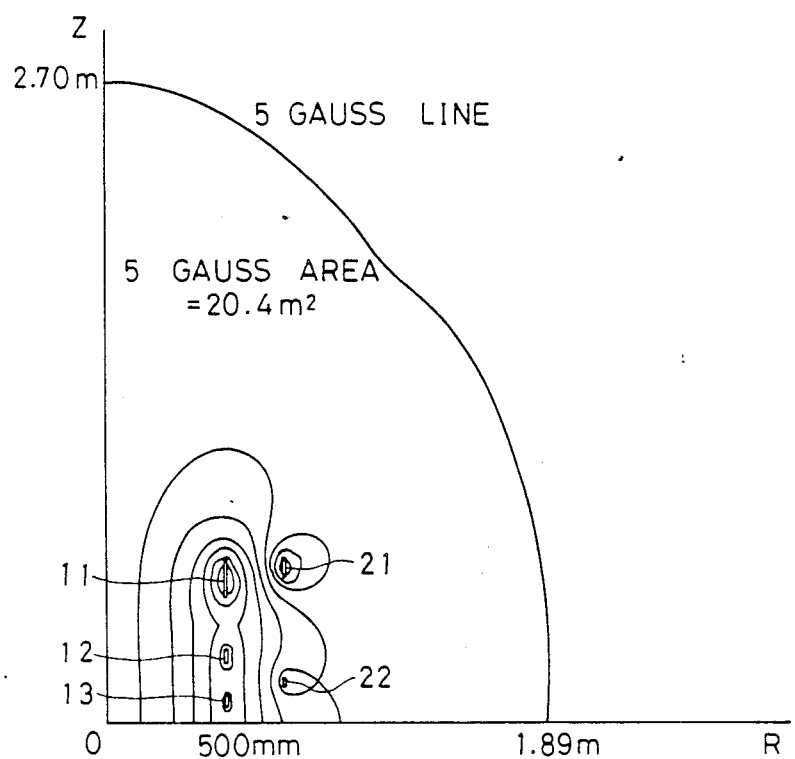
FIGS. 6 and 7 are diagrams illustrating a magnetic flux distribution and a magnetic field homoneneity of another embodiment according to the present invention, respectively.
Figure 7:
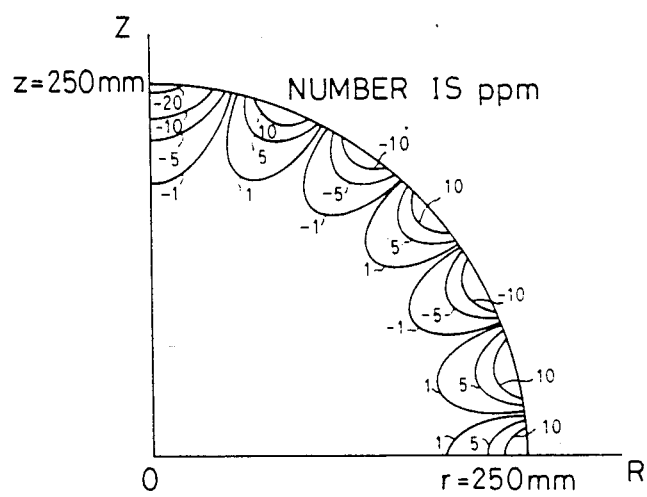

The flux distribution, 5 gauss line and field homogeneity in the type-B coil configuration are shown in FIGS. 6 and 7 respectively. In FIG. 6, the positions of the main coils 11, 12 and 13, canceling coils 21 and 22 are also indicated. In the type-B coil configuration, as shown in Table 2, the inhomogeneous flux component induced by the canceling coils is completely unacceptable, because the length of the canceling coils was decreased until it equaled that of the main coils in the direction of the Z-axis. However, the main coils are arranged in such a manner that they compensate the inhomogeneous flux components induced by the canceling coils from the 2nd order to the 10th order, so that the resultant nonhomogeneous flux components become zero from the 2nd to the 10th order.

In type-A coil configuration, the shape of the 5 gauss line is substantially circular and that in type-B coil configuration is substantially elliptical. However, the flux distributions and the field homogeneity of both configurations are nearly same.

Figure 8:
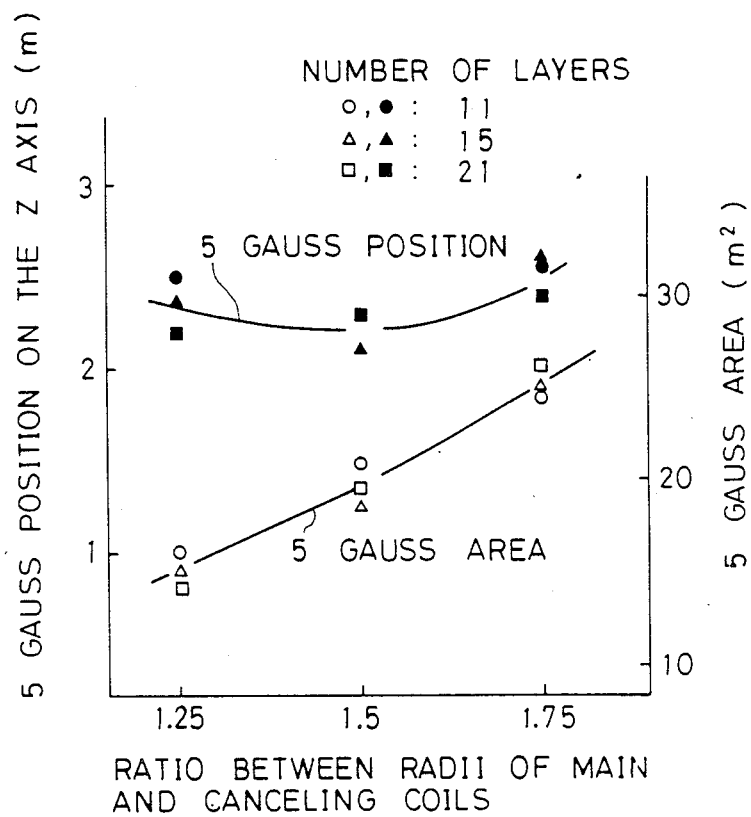
FIG. 8 is a diagram illustrating the dependence of the 5 gauss area and 5 gauss position on the Z-axis on the ratio between the radii of the main and the canceling coils in embodiment shown in FIG. 4.
Figure 9:
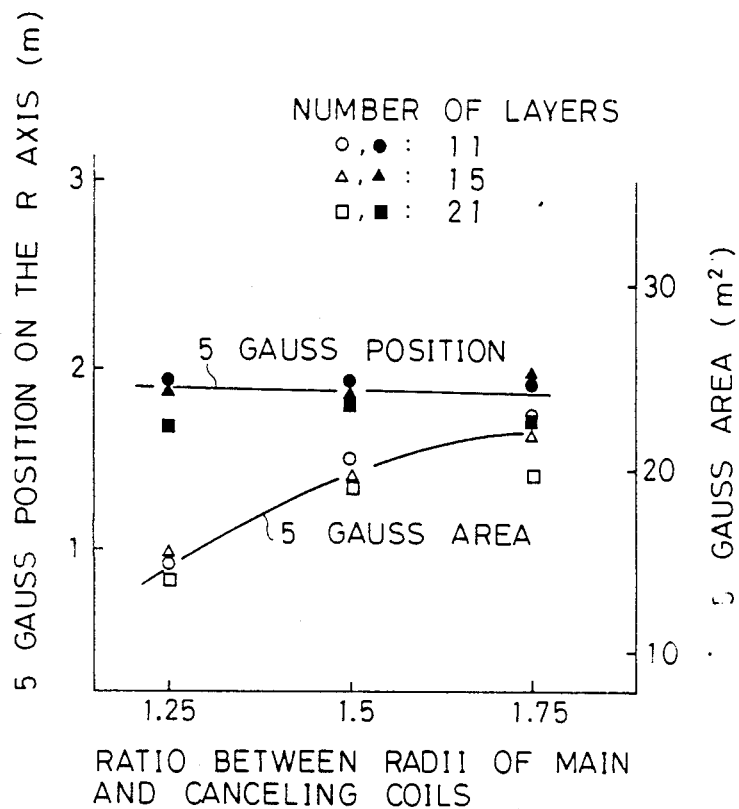
FIG. 9 is a diagram illustrating the dependence of the 5 gauss area and 5 gauss position on the R-axis on the ratio between the radii of the main and the canceling coils in embodiment shown in FIG. 6.

The relation between the value for the main coil radii and that for the canceling coil radii is examined under the condition that the central magnetic flux density is 0.5 T and the inner radius of the main coils is 500 mm. As shown in FIG. 8, the distance of the 5 gauss line from the origin on the Z-axis is invariable for the type-A coil configuration, while the 5 gauss area, which is 4 times the product of 5 gauss positions on the R-axis and the Z-axis, increases as the ratio between the radii increases. This means that the 5 gauss line illustrated in FIG. 4 shifts to R-axis direction when the ratio between the radii of the main and the canceling coils increases. However, for the type-B coil configuration, as shown in FIG. 9, the distance of the 5 gauss line from the origin on the R-axis is invariable, while the 5 gauss area increases as the ratio between the radii increases. This means that the 5 gauss line illustrated in FIG. 6 shifts to Z-axis direction when the ratio between the radii of main and canceling coils increases.

Figure 10:
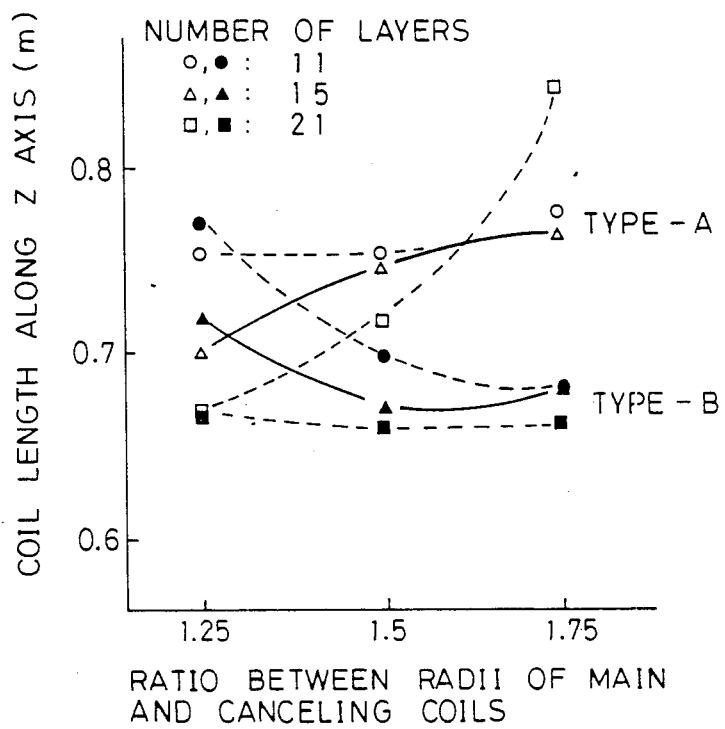
FIG. 10 is a diagram illustrating the dependence of the coil length on the ratio between the radii of the main and the canceling coils.

In FIG. 10, the relation between the coil length along the Z-axis and the ratio between the radii of the main and the canceling coils is illustrated. In type-A coil configuration, when the number of conductor layers is 11 the coil length is invariable but when the number of conductor layers is 21 the coil length increases as the ratio between the radii of the main and the canceling coils increases. While in the type-B coil configuration the coil length reduces as the number of the conductor layer increases and further the coil length does not increase as the ratio between the radii of the main and the canceling coils increases.

Figure 11:
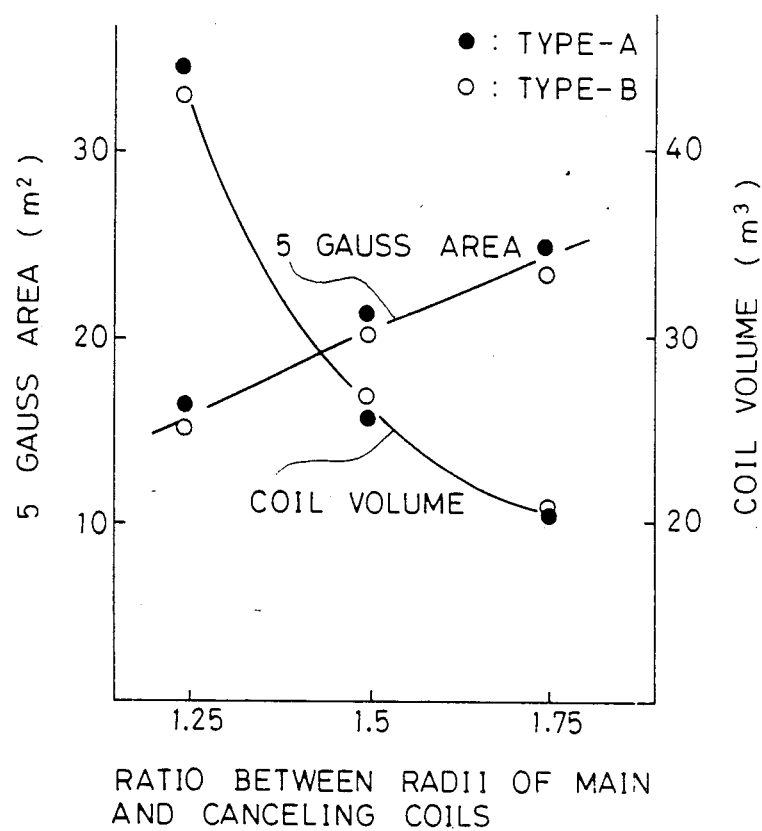
FIG. 11 is a diagram illustrating the dependence of the 5 gauss areas and the coil volumes on the ratio between the radii of the main and the canceling coils.

When the number of conductor layers is 11, the variation of the 5 gauss areas and the coil volumes with the ratio between the radii of the main and the canceling coils are examined. The size of the 5 gauss areas for and the coil volumes of the type-A and type-B coil configurations are similar, as shown in FIG. 11. Since the length of the coils along the Z-axis is shorter with the type-B coil configuration, as shown in FIG. 10, a compact, active shielding magnet can be designed with that coil configuration.

The optimum condition search is performed by numerical computation using a computer. The computing precision used at that time includes effective digits of 15 presented as a result of using what is called a double precision real number expressing one real number with 16 bytes, which is normally used for high precision type calculation. Hence, sufficient computing precision can be held in searching the optimum condition for securing precision at $1 \times 10^{-6}$ level.

How to search the optimum, condition for reducing the coefficients of terms up to the 10th order of Taylor's series expanded with respect to the strength distribution of a magnetic field on the symmetry axis algebraically means solving non-linear simultaneous equations. The coefficients of these simultaneous equations can be obtained as a form of strength of a magnetic field generated on the symmetry axis by each coil or differencial coefficients with respect to the coordinate function offered in the direction of the symmetry axis of that strength. The calculating expression of the magnetic field strength is an expression for the density of the magnetic flux generated on the rotation axis by a circular coil. Since this expression is a simple algebraic equation, it is easy to rapidly execute the calculation of the coefficients of the above-mentioned non-linear simultaneous equations using an ordiginary general purpose computer. Furthermore, since the non-linear simultaneous equations contain five unknowns, it is possible to obtain solutions with given accuracy using the repeated calculation method such as the Newton-Raphson method except the practical problem that proper initial values must be set not to diverge these solutions.

As described above, the present invention can secure given homogeneity in given homogeneous space by constructing a first coil unit of an internal coil by means of three pairs of coils in a coil for generating a homogeneous magnetic field used in the active shield type superconducting MRI and can clear the magnetic field leaked outside of the given homogeneous space by setting the magnetic moment of a second coil unit in proportion to a product of current flowing through the coil and the area of a circle enclosed by the coil to be equal in magnitude to and opposite in direction to that of the first coil unit. Furthermore, the number of coils composing the second coil unit is two pairs and the axial length of the second coil unit is made to substantially coincide with that of the first coil unit under the condition approximating to the optimum condition, so that the axial length of the coil for generating a homogeneous magnetic field can be minimized. Moreover, by making the inner diameter of each coil composing the first and second coil unit equal at each coil unit, it is able to wind each coil on same bobbin at each coil unit, and thus the bobbin can be manufactured and used with high precision in size, thereby producing a strongly built coil.

Furthermore, since a sum of pairs of coils composing the first coil unit and the second coil unit is 5, the number of turns of each coil at the final stage of the optimum condition searching calculation is set to satisfy the restraint condition in each coil and the construction in section of each coil is define in consideration of the sectional dimension of a superconductor and an inserted insulated film, following which it is possible to search the final optimum condition for reducing five coefficients of even order terms of 2nd to 10th degree to zero with the axial positions of coils assumed as unknowns.

The invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A coil assembly for generating a homogeneous magnetic field including: a first coil unit having at least one coil being symmetric with respect to a common symmetry axis and a symmetry plane located perpendicular to said symmetry axis; and a second coil unit having at least one coil being symmetric with respect to said symmetry axis and said symmetry plane, a minimum internal diameter of the coil of said second coil unit being larger than a maximum external diameter of the coil of said first coil unit, and wherein:
   said first coil unit comprises three pairs of coils;
   said second coil unit comprises two pairs of coils;
   the magnetic moment of said first coil unit is identical in magnitude to and reverse in direction to that of said second coil unit; and
   said first coil unit substantially reduces to zero the coefficients of the terms of the second to tenth order of Taylor's series expanded with respect to axial coordinate variables of distribution of magnetic fields on said symmetry axis generated by said first coil unit and said second coil unit.

2. A coil assembly for generating a homogeneous magnetic field as claimed in claim 1, wherein the axial length of said second coil unit is substantially equal to that of said first coil unit.

3. A coil assembly for generating a homogeneous magnetic field as claimed in claim 1, wherein the axial external length of said second coil unit is larger than that of said first coil unit.

4. A coil assembly for generating a homogeneous magnetic field as claimed in claim 1, wherein the three pairs of coils of said first coil unit have the same internal diameters and the two pairs of coils of said second coil unit have the same internal diameters.

5. A coil assembly for generating a homogeneous magnetic field as claimed in claim 2, wherein said second coil unit reduces to zero the coefficients of the terms of the second to sixth order of Taylor's series expanded with respect to axial coordinate variables of distribution of magnetic fields on said symmetry axis generated solely by said second coil unit.

6. A coil assembly for generating a homogeneous magnetic field as claimed in claim 3, wherein said second coil unit does not reduce to zero the coefficients of the terms of the second to sixth degree of Taylor's series expanded with respect to axial coordinate variables of distribution of magnetic fields on said symmetry axis generated solely by said second coil unit.

7. A coil assembly for generating a homogeneous magnetic field as claimed in claim 1, wherein said first coil unit is electrically connected to said second coil unit in series.

8. A coil assembly for generating a homogeneous magnetic field as claimed in claim 1, wherein said three pairs of coils of said first coil unit and said two pairs of coils of said second coil unit are electrically connected in series, respectively.

9. A coil assembly for generating a homogeneous magnetic field as claimed in claim 1, wherein said three pairs of coils of said first coil unit and said two pairs of coils of said second coil unit are electrically connected in parallel, respectively.

10. A coil assembly for generating a homogeneous magnetic field as claimed in claim 1, wherein said coils have layers of conductors and the layers of conductors in each of the coils comprising said first and second coil units are equal in number.

* * * * *